United States Patent
Lin et al.

(10) Patent No.: US 7,071,478 B2
(45) Date of Patent: Jul. 4, 2006

(54) SYSTEM AND METHOD FOR PASSING PARTICLES ON SELECTED AREAS ON A WAFER

(75) Inventors: Wen Chin Lin, Hsin-Chu (TW); Denny Tang, Saratoga, CA (US); Li-shyue Lai, Jhube (TW); John Chern, Hsin Chu (TW); Jyh-Chyurn Guo, Hsinchu (TW); Wan-Yih Lien, Hsin-chu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 195 days.

(21) Appl. No.: 10/816,612

(22) Filed: Apr. 2, 2004

(65) Prior Publication Data

US 2005/0218346 A1    Oct. 6, 2005

(51) Int. Cl.
*G21K 4/00*    (2006.01)

(52) U.S. Cl. .............................. 250/492.22; 250/491.1

(58) Field of Classification Search ........... 250/492.23, 250/492.22, 492.2, 491.1
See application file for complete search history.

(56) References Cited

U.S. PATENT DOCUMENTS

| | | | |
|---|---|---|---|
| 6,046,109 A | 4/2000 | Liao et al. .................. 438/689 |
| 6,214,750 B1 | 4/2001 | Liao ........................... 438/798 |
| 6,323,500 B1 * | 11/2001 | Yamashita ............. 250/492.23 |
| 6,362,489 B1 * | 3/2002 | Okino ...................... 250/491.1 |
| 6,563,125 B1 * | 5/2003 | Suzuki .................. 250/492.21 |
| 6,624,429 B1 * | 9/2003 | Wolfe et al. ........... 250/492.22 |
| 6,852,988 B1 * | 2/2005 | Li ........................... 250/491.1 |
| 2005/0077485 A1 * | 4/2005 | Wang et al. ............. 250/492.2 |

* cited by examiner

*Primary Examiner*—Kiet T. Nguyen
(74) *Attorney, Agent, or Firm*—Duane Morris LLP

(57) ABSTRACT

A method and system is disclosed for directing charged particles on predetermined areas on a target semiconductor substrate. After aligning a wafer mask with a semiconductor wafer, with the wafer mask having one or more mask patterns thereon, the charged particles are directed to pass through the mask patterns to land on one or more selected areas on the semiconductor wafer.

29 Claims, 4 Drawing Sheets

SYSTEM AND METHOD FOR PASSING PARTICLES ON SELECTED AREAS ON A WAFER

BACKGROUND

The present disclosure relates to charged particle beam microlithography systems used for the fabrication of integrated circuits. More specifically, the disclosure pertains to the systems and methods for passing high energy charged particles through wafer masks to wafers to define regions on the wafer.

The manufacture of integrated circuits (IC) requires the use of many microlithography process steps to define and create specific circuit patterns and components onto the semiconductor wafer. As IC device performance demands migrate to higher levels, lithography technology has evolved both to higher performance levels, as well as to new and additional process applications. Microlithography has expanded from the traditional use of photo energy to transfer circuit/component images onto the wafer substrate, to the use of charged particle beams such as electron, proton and molecular beams for both circuit imaging and substrate modifications. For example, high performance ICs may require the fabrication of semi-insulator regions on a wafer for improved circuit/component isolation, high Q inductors for high signal frequency stability, and high resistance structures for specific circuit components. Charged particle beam (CPB) microlithographic processes are commonly used to fabricate the above said regions and components.

FIG. 1 illustrates a conventional charged particle beam (CPB) microlithography system 100. Such system comprises a CPB source 102 to generate a charged particle beam to travel through the microlithography system along the particle beam axis 104 within the system to eventually strike the wafer 106 located on a wafer stage 108. After exiting from the source 102, the CPB 110 may pass through, if needed, various beam apertures 112 and beam lens/deflection subsystems 114 before transmission through a mask reticle 116 that is mounted upon a mask stage 118. After passing through the mask reticle, the now imaged CPB may pass through additional beam lens subsystems 120 to focus and project the CPB onto the target wafer 106. It is noted that various CPB microlithography systems may incorporate various beamline designs such that apertures 112 and beam lens subsystems 114 and 120 may be of different quantities, designs and lengths.

For conventional CPB systems employing high energy particle beams such as proton beams greater than certain levels of energy (e.g., 3 MeV (million electron-volts)), there are serious issues associated with the use of such proton beams. High energy particles are particles projected at higher velocities and higher power, generating additional heat loads for the CPB system. Heat from the CPB induced upon the system may cause damage to the system components enough to disturb the alignment integrity of the imaged beam to the targeted wafer. Heat damage to the imaging mask reticle may result in distorted, improper images on the wafer.

Referring back to FIG. 1, the higher energy particles may have more divergence upon exit from the aperture 112 as well as the mask reticle, enough to create distorted, improper images onto the wafer. Furthermore, there is no good controlling mechanism like the deflection subsystem 114 to control the flow of the particles. More importantly, the distance 122 between the mask reticle 116 and the wafer 106 in a conventional system tends to be too big to handle high energy particles due to the divergence. Further, the current mask reticle or other masking materials associated therewith are not well suited for precisely controlling and transmitting the proper collective beam energy upon each predetermined area of the wafer.

What is needed is an improved method and system for sufficiently and efficiently resolving the above issues related to the use of high energy CPBs.

SUMMARY

A method and system is disclosed for directing charged particles on predetermined areas on a target semiconductor substrate. After aligning a wafer mask with a semiconductor wafer with the wafer mask having one or more mask patterns thereon, the charged particles are directed to pass through the mask patterns to land on one or more selected areas on the semiconductor wafer.

One application for using such an improved method and system is for generating semi-insulating areas on a semiconductor wafer.

These and other aspects and advantages will become apparent from the following detailed description, taken in conjunction with the accompanying drawings, illustrating by way of example the principles of the disclosure.

DESCRIPTION

The present disclosure provides a method for exposing selected areas on a target wafer to charged particles. A CPB system incorporating an energy source such as a electromagnetic radiation source including laser, ultra-violate, infrared, or microwave source is used. It is also understood that charged particles generated by the CPB system can be of various configurations. For example, they can be frequently used charged protons. Also, the term "beam" has a broad sense for defining its shape as it does not intend to limit the charged particles to conform to any particular shape. Generally speaking, the area that the charged particles land on will be confined to a certain shape and size, but the particles in the CPB may take different directions, but they are in the general direction for "bombarding" the landed area.

Since making a semi-insulating area on a semiconductor wafer requires such a high energy CPB microlithography, the present disclosure is further described below in the context of making a semi-insulating area on a semiconductor wafer. It is understood, however, that making a semi-insulating area is only one application for the method disclosed.

Figure 1:
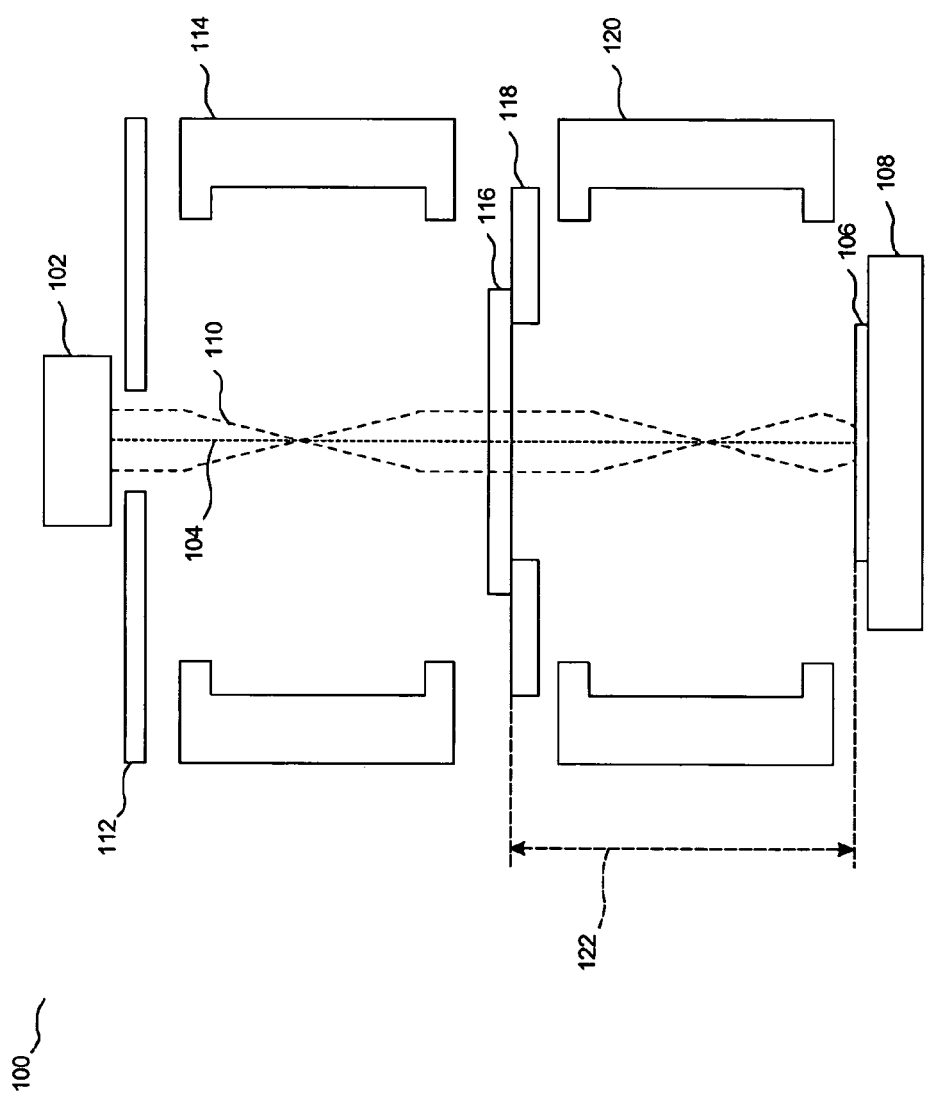
FIG. 1 illustrates a conventional charged particle beam microlithography system.
Figure 2:
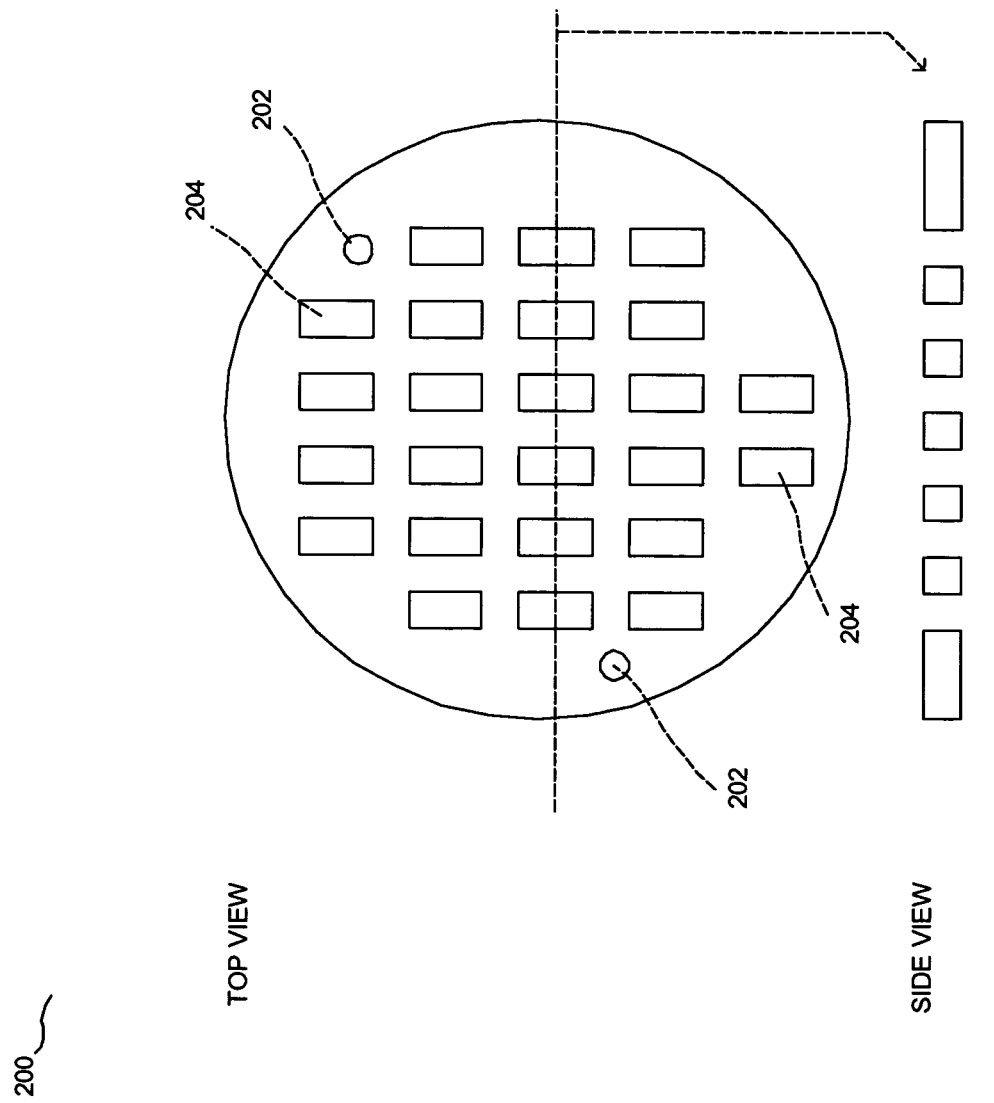
FIG. 2 illustrates a wafer mask according to one example of the present disclosure.

FIG. 2 illustrates a top view of a wafer mask 200 in accordance with one example of the present disclosure. Unlike the photo masks that are made from solid material, such as quartz, the wafer mask 200 is generally constructed from a regular silicon wafer material having the exact same shape and similar material content as a production wafer. Two alignment markers 202 are located at predetermined locations, generally in the perimeter of the mask as shown. One or more mask patterns or mask patterns 204 are located within the wafer mask 200. The locations of these mask patterns are determined by different circuit designs. Each mask pattern 204 can also be different from others. They do not have to have the same configuration. For example, the mask patterns can be all simple openings of a particular size, but they can be all of the same shape, but with different sizes. Moreover, they do not even have to be of the same shape. Taking the need for making semi-insulating areas, for example, the mask patterns can be just plain openings, but they can also be of a particular shape such as a rectangular "donut" shape, wherein each opening is a ring shaped square with its center wafer portion remaining unremoved. Therefore, the CPB will pass only the "ring". In short, the wafer mask 200 has the pattern for allowing the CPB to be transmitted through.

It is noted that the alignment mark areas 202 of the wafer mask may also be of a different shape. They are located in areas wherein the CPB is allowed to pass without concern to any damaging impacts for the production of semi-insulating areas on the target wafer. Further, the thickness of the wafer mask may be different from the regular production wafer due to durability concerns, but they can be the same for the convenience in making such wafer masks. For example, the thickness of the wafer mask can be between 100 um to 800 um. Another aspect of the wafer mask for consideration is the vertical sharpness of the sidewalls of the mask patterns or openings. The vertical sharpness may be defined by an angle between the surface of the sidewall and the surface of the wafer mask. Ideally, when the mask patterns are formed by etching or other removal process, the sidewalls should be perfectly perpendicular to the surface of the wafer mask. However, in practice, it can be tolerated that this angle is somewhere between 80 to 100 degrees.

Figure 3:
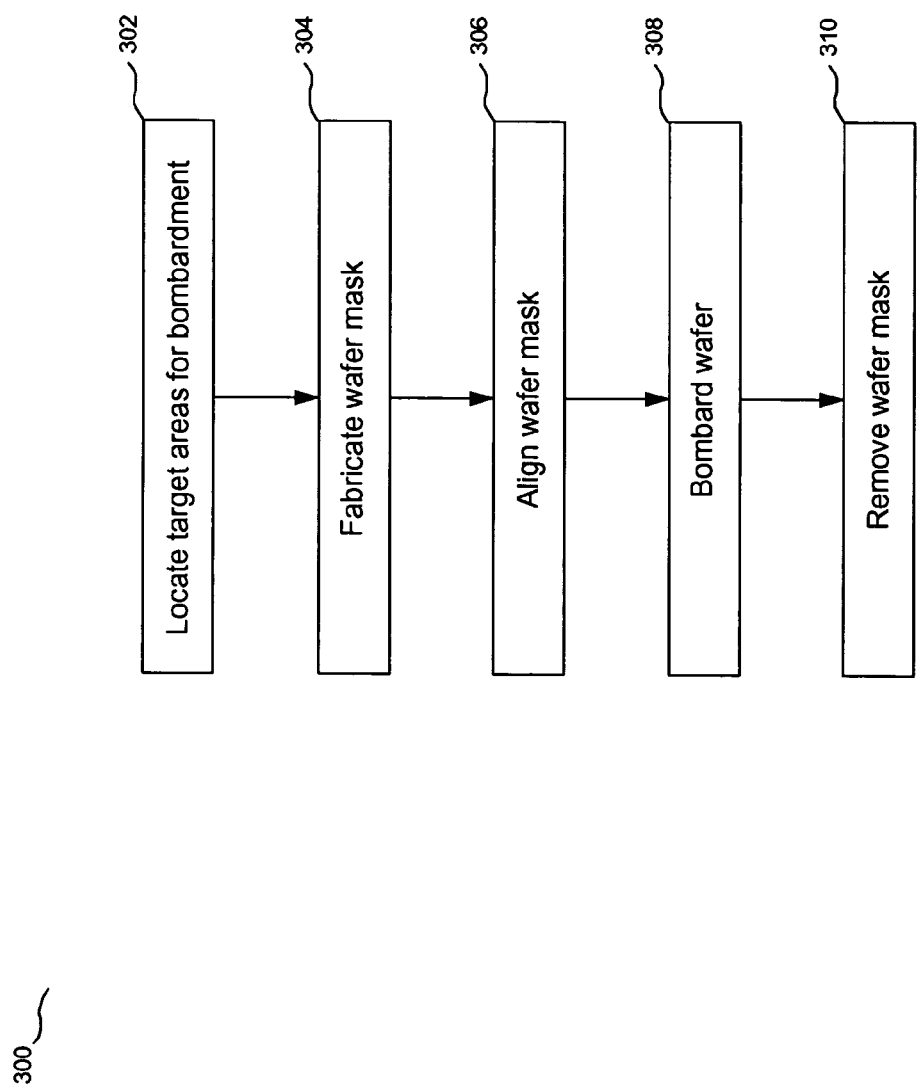
FIG. 3 illustrates a flow chart showing a process for exposing selected areas on a production wafer to charged particles.

FIG. 3 is a flow diagram 300 illustrating a process for exposing selected areas of a production wafer to the CPB. Initially, it is determined in step 302 where the target areas on a production wafer are located for receiving the CPB bombardment. This can be done by typical computer systems with relevant software used in the manufacturing facility. For example, a design file is searched to identify locations of the target areas. Once it is known, a wafer mask is fabricated with predetermined mask patterns formed thereon in step 304. This can be done by conventional machines such as the etching machine, or any other machine that has the ability to remove parts of the production wafer. Depending on the design requirement, the shape, size and other aspects of the mask patterns are taken into consideration.

After obtaining the wafer mask, the wafer mask is aligned in step 306 with the production wafer in close proximity using existing alignment technologies used in the semiconductor manufacturing facilities. As such, the production wafer is underneath a wafer mask, and certain areas thereon are exposed by the mask patterns of the wafer mask. The aligning step can be conducted using existing optical alignment tools. For instance, a light beam may shoot through the alignment patterns to land on corresponding alignment markers on the wafer. It is noticed that, unlike using a photo mask, the wafer mask is not placed on a photo mask holder, but instead, located as close as possible to the production wafer. In one example, the wafer mask is actually bonded to the production wafer. In yet another example, special glues are used for bonding. There are various ways to keep the wafer mask and the production wafer together. If bonded, the distance between them can be as small as the bonding technology used. If not directly bonded, they can still be kept aligned with a small distance there between. Certain spacers may be used to keep these two wafers evenly separated. In step 308, the two wafers are subject to a CPB bombardment for a predetermined period of time. The charged particles land substantially perpendicularly on the areas exposed through the wafer mask. Since the CPB only passes the mask patterns on the wafer mask, only selected areas on the production wafer receive the bombardment. For making the semi-insulating areas, the selected areas may have to receive transferred collective energy over a predetermined threshold. The CPB used may be of an energy level between 0.5 to 5 MeV. Further, the fluence of the charge particles may be between $1E14$ ea/cm$^2$ to $1E17$ ea/cm$^2$. The areas exposed by the wafer mask have a change in their resistivity so that they are higher than other areas that are not exposed to the charged particles. The CPB bombardment improves Q value of the areas on the production wafer that have received the charges. After the bombardment process is completed, the wafer mask is removed from the production wafer in step 310.

Figure 4:
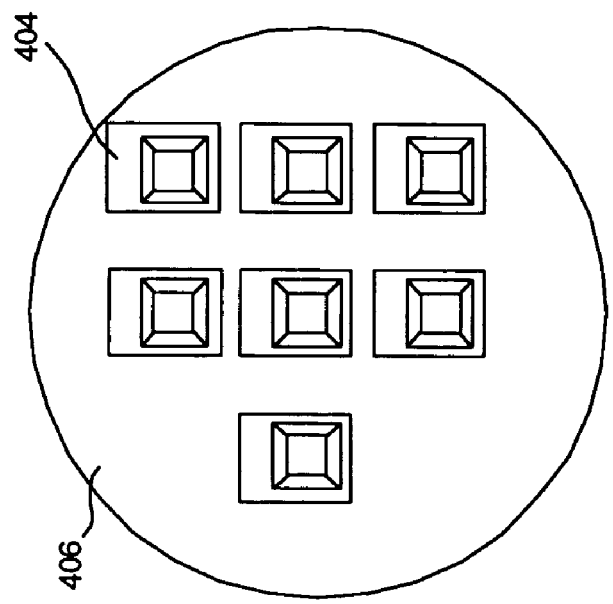
FIG. 4 illustrates a wafer mask according to another example of the present disclosure.
Figure 4:
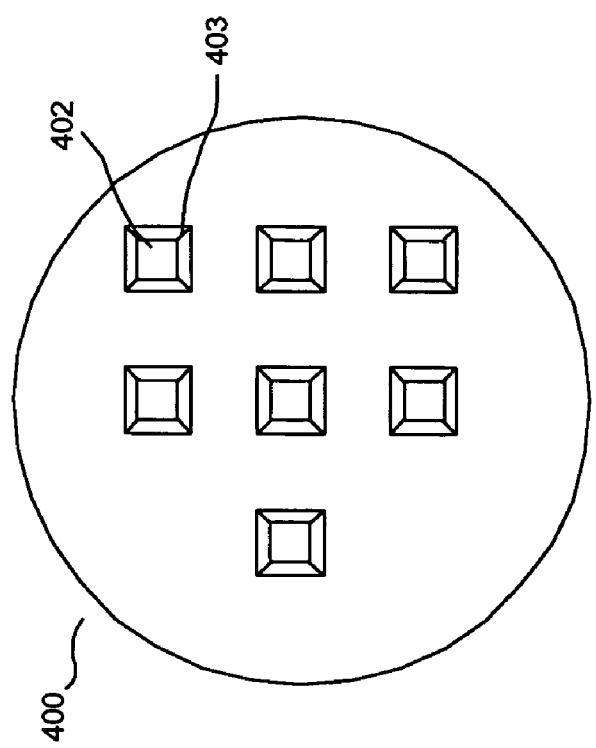

FIG. 4 illustrates a wafer mask 400 having "frame" shaped mask patterns 402 used for creating frame shaped semi-insulating areas 404 on a production wafer 406. As it is understood, other shapes of the wafer mask patterns can be also generated for the wafer mask so that different shapes of CPB exposure area can be resulted on the production wafer. For example, the center portion can also be a circular piece so that the semi-insulating areas are "ring" shaped. In essence, the mask patterns are openings with their center piece unremoved. The openings may take different shapes too, which are not limited to rectangles. Furthermore, the unremoved center portion is attached to the periphery of the opening through one or more "string like" attachment pieces 403. As such, the center portion blocks the charged particles, and prevents them from hitting the semiconductor area underneath.

The present disclosure described above provides a viable system and methodology for the usage of charged particle beams in microlithography systems for bombarding certain areas on a production wafer.

The described systems and methods of the present disclosure may be compatible and used within existing microlithography systems, including scanner, stepper and contact lithography systems. This compatibility allows for easy implementation into currently existing IC fabrication operations. It is also noted that the system and methods used in accordance with the present disclosure are applicable to future generations of microlithography systems and process technologies, as well as to the older systems and technologies. Using the methods illustrated in the present disclosure, the process integrity, control and yields of the microlithography operation will be higher than conventional method, and overall system safety, maintainability and complexity will be simpler with reduced operational costs.

The above disclosure provides many different embodiments, or examples, for implementing different features of the invention. Specific examples of components, and processes are described to help clarify the invention. These are, of course, merely examples and are not intended to limit the invention from that described in the claims.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A method for exposing one or more areas on a semiconductor wafer to charged particles, comprising:
   aligning a wafer mask, having one or more mask patterns thereon, with the semiconductor wafer;
   bonding the semiconductor wafer with the wafer mask; and
   passing the charged particle through then mask patterns to land on one or more selected areas on the semiconductor wafer.

2. The method of claim 1 wherein the charged particle transform semiconductor materials in the selected areas to have a higher resistivity than other areas not exposed to the charged particle.

3. The method of claim 2 wherein the selected areas become semi-insulating areas after receiving the charged particles with a collective energy level exceeding a predetermined threshold.

4. The method of claim 1 wherein the wafer mask has one or more alignment patterns thereon for aligning with the semiconductor wafer.

5. The method of claim 1 wherein the mask patterns are openings with their center portions unremoved.

6. The method of claim 5 wherein the openings are in rectangle shape.

7. The method of claim 1 wherein the wafer mask is made from a silicon wafer having a thickness between 100 um to 800 um.

8. The method of claim 1 wherein an angle between sidewalls of the mask patterns on the wafer mask and the surface of the wafer mask is between 80 to 100 degrees.

9. The method of claim 1 further comprising:
   determining the one or more selected areas on the semiconductor wafer for receiving the charged particles; and
   generating the wafer mask having the mask patterns containing thereon for passing the charged particles to land on the selected areas when the semiconductor wafer is aligned with the wafer mask.

10. The method of claim 1 wherein the charged particles are protons.

11. The method of claim 1 wherein the charged particles have an energy level between 0.5 to 5 MeV.

12. A method of exposing one or more areas on a semiconductor wafer to charged particles for making semi-insulating areas, comprising:
    aligning a wafer mask, having one or more mask patterns thereon, with the semiconductor wafer, with the mask being a predetermined proximity to the semiconductor wafer;
    bonding the semiconductor wafer with the wafer mask;
    generating the charged particles; and
    directing the charged particles through the mask patterns to land on one or more selected areas on the semiconductor wafer,
    wherein semiconductor materials in the selected areas of the semiconductor wafer are transformed to have a higher resistivity than those not exposed to the charged particles.

13. The method of claim 12 wherein the selected areas become semi-insulating areas.

14. The method of claim 12 further comprising:
    determining one or more selected areas on the semiconductor wafer for receiving the charged particles; and
    generating a wafer mask having one or more mask patterns contained thereon for passing the charged particles.

15. The method of claim 12 wherein the wafer mask has one or more alignment patterns thereon for aligning with the semiconductor wafer.

16. The method of claim 12 wherein the mask patterns are rectangular openings.

17. The method of claim 12 wherein the mask patterns are rectangular openings with their center portions of wafer material unremoved.

18. The method of claim 12 wherein the wafer mask has a thickness between 110 um to 800 um.

19. The method of claim 12 wherein an angle between sidewalls of the mask patterns on the wafer mask and the surface of the wafer mask is between 80 to 110 degrees.

20. The method of claim 12 wherein a fluence of the charge particles is between 1E14 ea/cm$^2$ to 1E17 ea/cm$^2$.

21. The method of claim 12 wherein the charged particles land substantially perpendicularly to the selected areas.

22. A system for exposing one or more areas on a semiconductor wafer to charged particles, comprising:
    means for aligning a wafer mask, having one or more mask patterns thereon with the semiconductor wafer;
    means for bonding the semiconductor wafer with the wafer mask:
    means for generating the charged particles; and
    means for directing the charged particles through the mask patterns to land on selected areas on the semiconductor wafer.

23. The system of claim 22 further comprising means for determining one or more selected areas on the semiconductor wafer for receiving the charged particles.

24. The system of claim 22 further comprising means for generating the mask patterns for passing the charged particles.

25. The system of claim 24 wherein the means for generating the mask further includes means for generating one or more alignment patterns thereon for aligning with the semiconductor wafer.

26. The system of claim 24 wherein the mask patterns are rectangular openings.

27. The system of claim 24 wherein the mask patterns are rectangular openings with their center portions of wafer material unremoved.

28. The system of claim 22 wherein the means for generating charged particles generates the charged particles with an energy level above 0.5 MeV.

29. The system of claim 22 wherein the means for generating charged particles generates the charged particles with an energy level below 5 MeV.

* * * * *